United States Patent
Cote et al.

(12) 
(10) Patent No.: US 6,695,149 B1
(45) Date of Patent: Feb. 24, 2004

(54) TECHNIQUES FOR FASTENING A PANEL TO AN ELECTRONIC CABINET FRAME

(75) Inventors: Gerald J. Cote, Westborough, MA (US); Albert Beinor, Sutton, MA (US); Ilhan Gundogan, Lexington, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 10/215,573

(22) Filed: Aug. 9, 2002

(51) Int. Cl.[7] .................................................. A47F 5/00
(52) U.S. Cl. ...................... 211/26; 211/182; 312/265.1; 403/397
(58) Field of Search .................... 211/26, 182, 189; 312/265.1, 265.2, 265.3, 265.4, 265.5, 265.6, 223.2; 403/384, 397

(56) References Cited

U.S. PATENT DOCUMENTS

| | | | |
|---|---|---|---|
| 2,655,761 A | * 10/1953 | Adams | |
| 4,644,614 A | * 2/1987 | Mizusawa | |
| 4,966,482 A | * 10/1990 | Fujimoto | |
| 4,966,487 A | * 10/1990 | Sinkoff | |
| 5,520,477 A | * 5/1996 | Fink | 403/397 |
| 5,810,459 A | 9/1998 | Barrett et al. | 312/111 |
| 6,168,249 B1 | * 1/2001 | Chien | 312/265.4 |
| 6,354,680 B1 | * 3/2002 | Lin et al. | 312/223.2 |
| 6,382,748 B1 | 5/2002 | Flamme et al. | 312/257.1 |
| 6,510,803 B1 | 1/2003 | Agee | 108/147 |
| 6,527,351 B1 | * 3/2003 | Sevier et al. | 312/265.2 |
| 6,550,880 B2 | * 4/2003 | Reuter | 312/265.3 |
| 2002/0153338 A1 | * 10/2002 | Orr | 211/183 |

OTHER PUBLICATIONS

2002/0153338, Oct. 24, 2002, Orr.*

* cited by examiner

Primary Examiner—Robert W. Gibson, Jr.
(74) Attorney, Agent, or Firm—Chapin & Huang, L.L.C.; David E. Huang, Esq.

(57) ABSTRACT

A technique for fastening a panel to an electronic cabinet frame involves inserting portions of rigid support members (e.g., rails) of the electronic cabinet frame into grooves defined by fasteners to attach the fasteners to the portions of the rigid support members of the electronic cabinet frame. The technique further involves positioning catches (e.g., latching members) of the panel adjacent catch members of the fasteners, and moving the panel toward the fasteners such that the catches of the panel engage with the catch members of the fasteners to fasten the panel to the electronic cabinet frame. Accordingly, no screws or other hardware is required to mount either the fasteners or the panel.

20 Claims, 9 Drawing Sheets

TECHNIQUES FOR FASTENING A PANEL TO AN ELECTRONIC CABINET FRAME

BACKGROUND OF THE INVENTION

In general, an equipment rack is a rigid frame-like structure for supporting an assortment of electronic equipment. The front of such a rack typically includes a pair of parallel vertical rails disposed a standard distance apart. The rails define mounting holes (e.g., pre-drilled circular holes, square holes, etc.) to enable electronic equipment to secure to the rails. Such a rack is suitable for supporting components of various electronic systems such as a general purpose computer system, a data storage system, network equipment, test equipment, power supply equipment, other types of equipment and combinations thereof.

Equipment racks are available in a variety of standard sizes. For example, one common width for an equipment rack is 19 inches, e.g., the mounting holes are approximately 18.3 inches apart. For this standard-width rack, electronic equipment manufacturers provide electronic equipment in chassis having heights in standard Rack Units. A Rack Unit (U) is 1.75 inches and typically covers the distance of two or three mounting holes along the rails of the front of the rack. It is common for conventional 19-inch equipment chassis to have heights in whole increments within the range of 1U to 6U's (e.g., 1U, 2U, 3U, and so on).

A typical equipment rack provides approximately 40 to 44 mounting holes along the vertical direction, i.e., along the rails. As such, the rack is well-suited for supporting electronic equipment (processors, disk drive arrays, network switches, power supplies, etc.), shelves, drawers, etc.

It is common for equipment rack manufacturers to offer blank panels or filler panels to cover unused openings of equipment racks. For example, suppose that a user purchases an equipment rack to house a data storage system. The user may populate the equipment rack with a variety of components (e.g., a power supply, a battery backup system, circuit boards, a disk drive array, etc.). After the user installs the equipment, the user may be left with a few standard-sized openings which remain unfilled (e.g., openings ranging between 1U and 6U's in height). The user can install blank panels to cover these openings thus preventing sensitive or critical equipment from being exposed (e.g., to prevent external objects from inadvertently entering the rack and contacting the equipment, to discourage unauthorized tampering, etc.).

One conventional approach to installing a blank panel over an opening of an equipment rack is for the user to mount a pair of catch members to the vertical rails at the opening of the rack using hardware. In particular, the user aligns holes of a first catch member over appropriate mounting holes of a first vertical rail (e.g., the front vertical rail on the left-hand side), and fastens the first catch member to the first vertical rail by attaching hardware through the aligned holes (e.g., screws, nuts and bolts, etc.). Then, the user secures a second catch member to a second vertical rail (e.g., the front vertical rail on the right-hand side) by attaching hardware in a similar manner. Finally, the user pushes a blank panel against the mounted catch members such that latching tabs of the blank panel latch the blank panel to the catch members thus holding the blank panel in place to cover the opening.

SUMMARY OF THE INVENTION

Unfortunately, there are deficiencies to the above-described conventional approach to mounting a blank panel to an equipment rack using hardware. For example, the use of hardware to fasten catch members to the vertical rails of the equipment rack increases the time and costs for installing blank panels. That is, the manufacturer must provide the hardware (e.g., screws, nuts, bolts, etc.) in addition to the catch members, and the user (e.g., the customer, a hired technician, etc.) must meticulously mount the catch members to the vertical rails using the provided hardware, thus increasing the overall costs and amount of labor involved in installing the blank panel.

Additionally, in some installation locations, electronic equipment may already be in operation prior to installing a blank panel. Unfortunately, it is dangerous to mount the catch members to the vertical rails using hardware while the electronic equipment is running. For example, a user could inadvertently drop a metal screw or a metal nut into the operating equipment while installing the catch members and the hardware and, thus, damage or destroy the equipment. As another example, the user could inadvertently touch a live conductor within the equipment rack with a conductive tool (e.g., a screwdriver, a wrench, etc.) used by the user when installing the catch members and the hardware and, thus, sustain an injury (e.g., a shock, a burn, etc.).

Furthermore, the user could accidentally drop or misplace the hardware prior-to installing the blank panel thus raising the possibility (i) that the blank panel will be installed unsafely or incorrectly (e.g., without all of the required hardware), or (ii) that the installation of the blank panel will be delayed (e.g., due to the additional time needed to obtain replacement hardware for proper installation).

In contrast to the above-described conventional approach to installing a blank panel over an opening of an equipment rack using hardware, the invention is directed to techniques for fastening a panel to an electronic cabinet frame using grooved fasteners that secure to the electronic cabinet frame without the need for hardware. The fasteners permit fastening of the panel to the frame in a reliable fashion. Accordingly, installation can occur in a quick and simple manner without requiring extensive hardware costs and installation time. Moreover, the fasteners (if made of non-conductive material or if coated with non-conductive material) minimize the possibility of causing equipment damage or injury that could otherwise occur due to dropped conductive hardware or due to contacting live conductors using conductive tools that typically attach the hardware in the conventional panel mounting approach. Furthermore, since hardware is unnecessary, there are no installation delays or improper installations due to missing hardware.

One embodiment of the invention is directed to a method for fastening a panel (e.g., a filler panel) to an electronic cabinet frame. The method includes the step of inserting portions of rigid support members (e.g., rails) of the electronic cabinet frame into grooves defined by fasteners to attach the fasteners to the portions of the rigid support members of the electronic cabinet frame. The method further includes the steps of positioning catches (e.g., latching tabs) of the panel adjacent catch members of the fasteners, and moving the panel toward the fasteners such that the catches of the panel engage with the catch members of the fasteners to fasten the panel to the electronic cabinet frame. Accordingly, no screws or other hardware is required to mount either the fasteners or the panel.

In one arrangement, the method further includes the steps of disengaging the catches of the panel from the catch members of the fasteners to unfasten the panel from the electronic frame, and prying the fasteners from the portions of the rigid support members of the electronic cabinet frame (e.g., manually opening the fasteners in a hinge-like manner) to detach the fasteners from the portions of the rigid support members of the electronic cabinet frame. Accordingly, the fasteners are removable from the frame without the need of a special hardware removal tool.

Another embodiment of the invention is directed to a rack system having an electronic cabinet frame to support electronic equipment. The electronic cabinet frame includes a set of rigid support members (e.g., vertical rails). The rack system further includes a panel assembly to cover an access area defined by the electronic cabinet frame. The panel assembly includes (i) a panel, and (ii) a set of fasteners to fasten the panel to an electronic cabinet frame. Each fastener has a base portion defining a groove such that, when a portion of a rigid support member of the set of rigid support members inserts within the groove defined by the base portion of that fastener, the base portion attaches to the portion of that rigid support member of the set of rigid support members. Each fastener further includes a catch portion coupled to the base portion of that fastener. The catch portion is configured to engage with the panel to fasten the panel to the electronic cabinet frame when the portion of that rigid support member of the set of rigid support members inserts within the groove defined by the base portion.

The features of the invention, as described above, may be employed in electronic systems, assemblies and methods such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for fastening a panel to an electronic cabinet frame using grooved fasteners that secure to the electronic cabinet frame without the need for hardware. The fasteners permit fastening of the panel to the frame in a reliable fashion. Accordingly, installation can occur in a quick and simple manner without requiring extensive hardware costs and installation time. Moreover, the fasteners (if made of non-conductive material or if coated with non-conductive material) minimize the possibility of causing equipment damage or injury that could otherwise occur due to dropped conductive hardware or due to contacting live conductors using conductive tools that a user typically uses to attach the hardware in a conventional panel mounting approach. Furthermore, since hardware is unnecessary, there are no installation delays or improper installations due to missing hardware.

Figure 1:
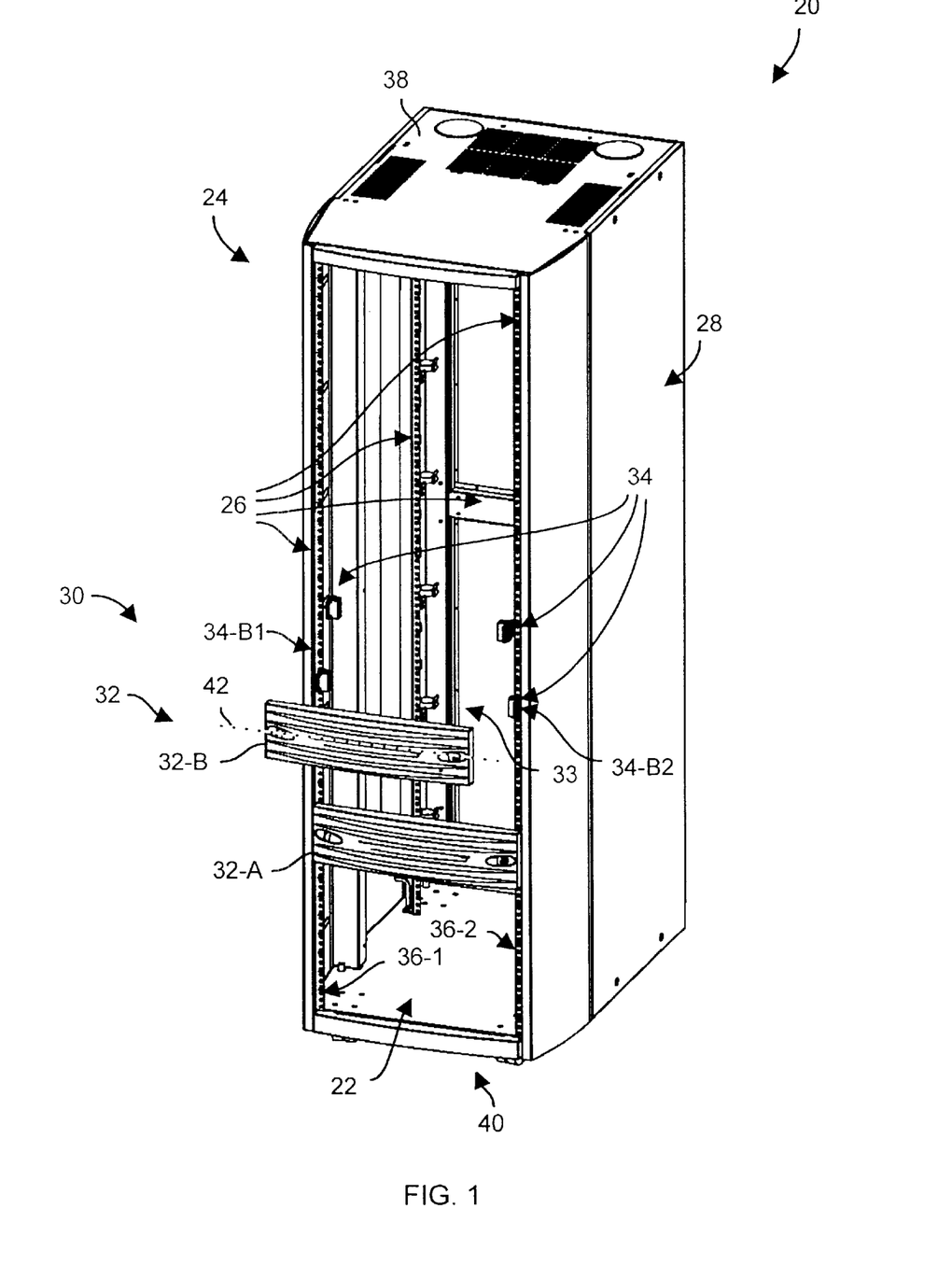
FIG. 1 is a perspective view of a rack system which is suitable for use by the invention.

FIG. 1 is a perspective view of a rack system 20 which is suitable for use by the invention. The rack system 20 includes an electronic cabinet frame 22 and a set of panel assemblies 24. The electronic cabinet frame 22 includes a set of rigid support members 26 (e.g., rails which define mounting holes, lateral beams, etc.). Among the panel assemblies 24 are side panel assemblies 28 and front panel assemblies 30. The rigid support members 26 of the electronic cabinet frame 22 are configured to support the panel assemblies 28, 30 as well as electronic equipment (e.g., computer equipment, data storage equipment, etc.).

Each front panel assembly 30 includes a panel 32 and a set of fasteners 34. FIG. 1 shows a front panel 32-A in a fastened state relative to the electronic cabinet frame 22, and another front panel 32-B in an aligned state and ready for fastening with the electronic cabinet frame 22. In one arrangement, the panel 32 of each panel assembly 30 is configured to cover a front access area (or opening) 33 of the electronic cabinet frame 22. By way of example only, the panels 32 of the panel assemblies 30 have standard-sized heights (e.g., 1U, 2U, etc.). Each panel 32 can be either a filler panel (e.g., a vented blank panel), or a panel which covers electronic equipment (e.g., a panel with access holes enabling a user to monitor and/or operate the equipment).

In general, to fasten a panel assembly 30 to the electronic cabinet frame 22, a user initially attaches a pair of fasteners 34 to the electronic cabinet frame 22 by inserting portions of the frame 22 into grooves of the fasteners 34. By way of example, a first fastener 34-B1 is attached to a first vertical rail 36-1 of the set of rigid support members 26 of the frame 22. Similarly, a second fastener 34-B2 is attached to a second vertical rail 36-2. The user then aligns a panel 32-B with the fasteners 34-B1, 34-B2, and moves the panel 32-B into engagement with the fasteners 34-B1, 34-B2. As a result, the panel 32-B fastens to the frame 22 without any need for hardware (also see the panel 32-A). Accordingly, risks associated with the use of conventional hardware (e.g., dropping conductive screws or nuts into a live cabinet, losing the hardware, etc.) are avoided.

It should be understood that the rack system 20 can include other components in addition to those described above. By way of example only, the rack system 20 further includes, among other things, a top panel assembly 38 with ventilation holes to allow heat to escape, and a bottom floor assembly 40 with wheels to allow the user to conveniently move the rack system 20 from one location to another (e.g., to enable the user to roll the rack system 20 across a floor). The top panel and bottom floor assemblies 38, 40 improve the structural stability and integrity of the electronic cabinet frame 22.

By way of example only, the panels 32 include latching mechanisms which are centered along their midlines 42. Accordingly, when a user attaches a panel 32 to a pair of fasteners 34, the panel 32 will reside such that it is centered around the fasteners 34. Further details of the invention will now be provided with reference to FIGS. 2 and 3.

Figure 2:
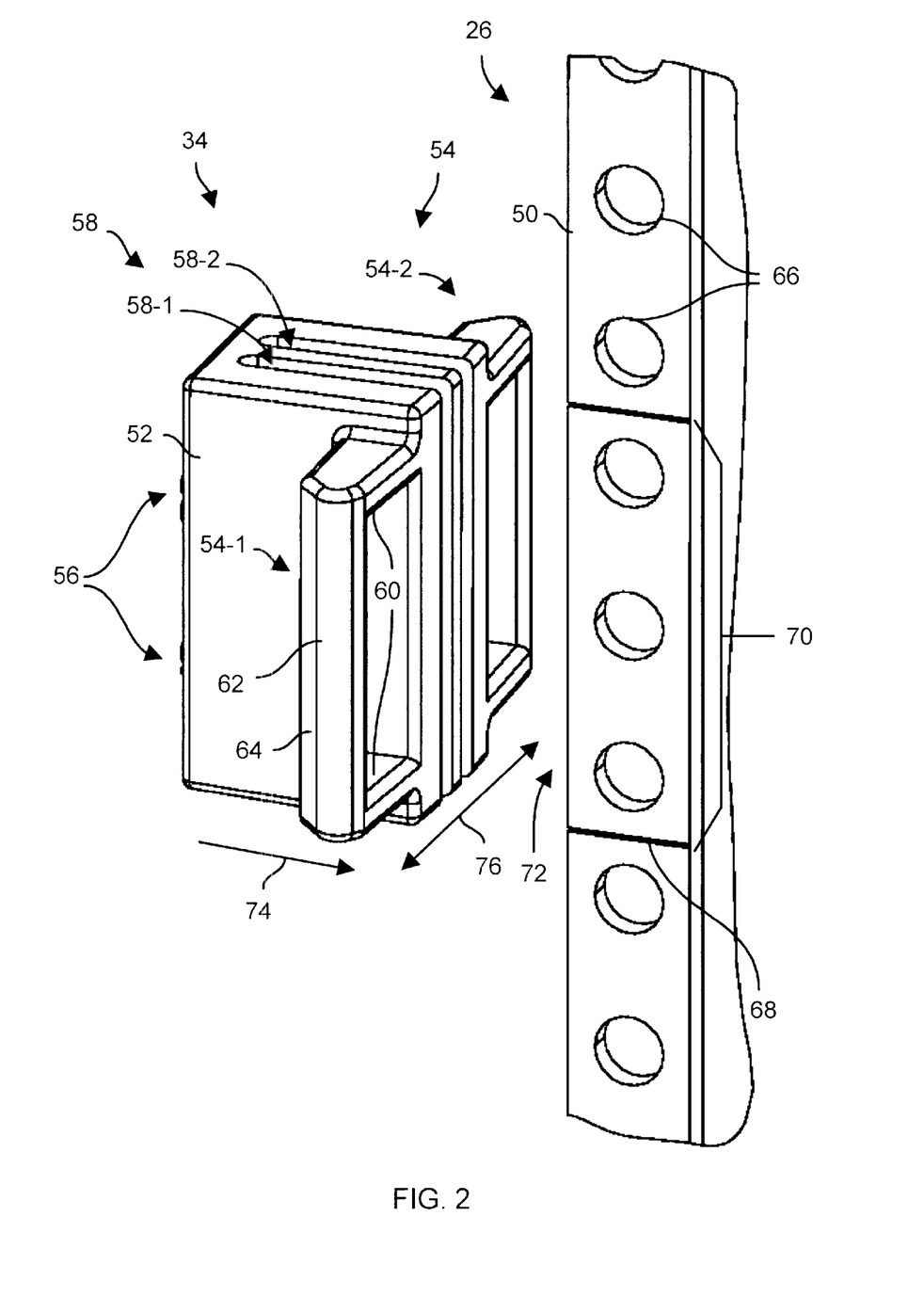
FIG. 2. is a perspective view of a portion of the rack system of FIG. 1 in an unconnected state.
Figure 3:
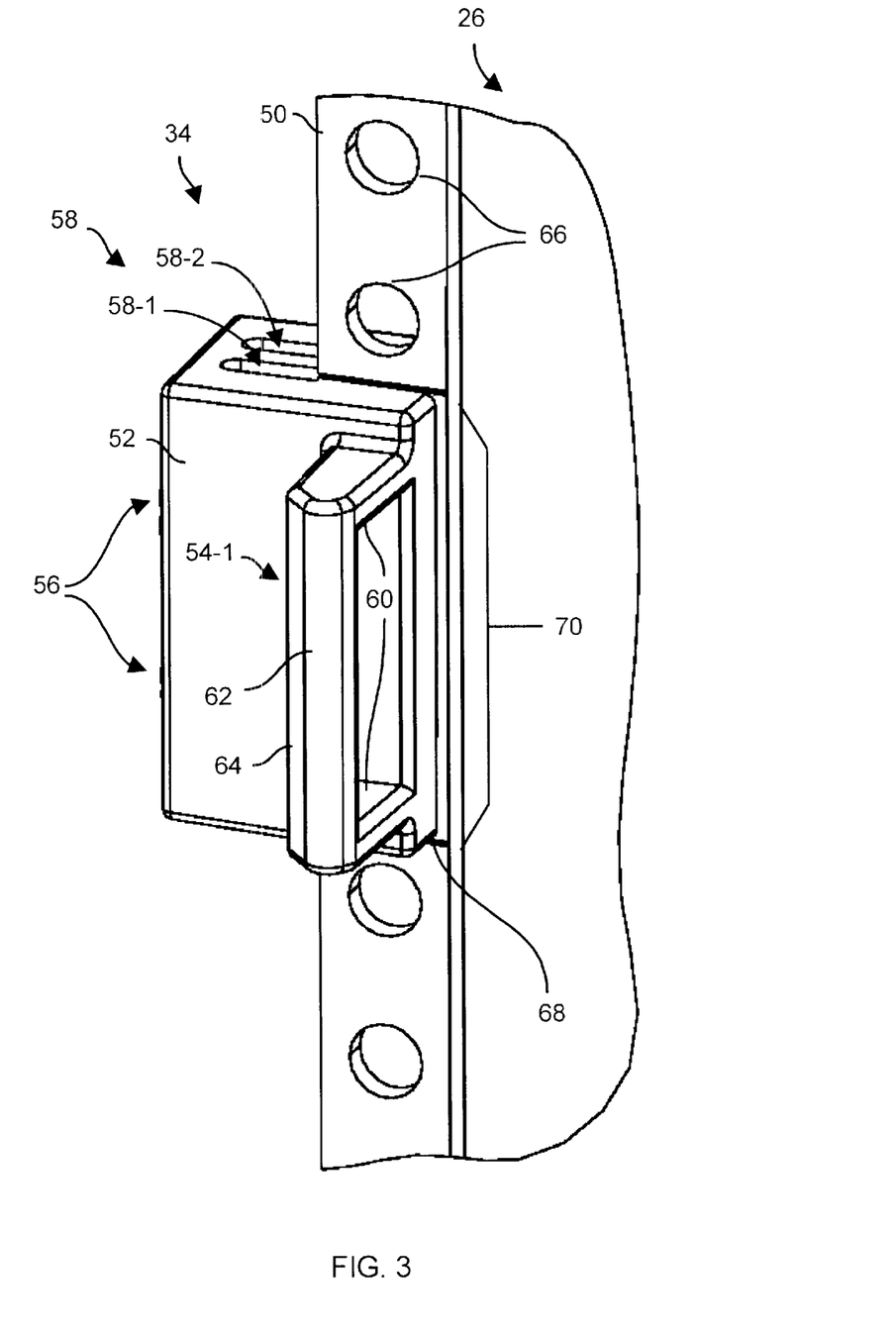
FIG. 3. is a perspective view of the portion of the rack system of FIG. 2 in a connected state.

FIGS. 2 and 3 show detailed perspective views of a fastener 34 and a portion 50 of a rigid support member 26 (e.g., a segment of the vertical rail 36-2, also see FIG. 1). As shown, the fastener 34 includes a base portion 52 and multiple catch portions 54-1, 54-2 (collectively, catch portions 54). The base portion 52 defines a set of symbols 56 and multiple grooves 58-1, 58-2 (collectively, grooves 58). Each groove 58-1, 58-2 is sized to accommodate the portion 50 of the rigid support member 26. By way of example only, the base portion 52 of the fastener 34 has a height that is substantially equal to a single standard height increment (e.g., 1U).

Each catch portion 54-1, 54-2 includes attachment arms 60 and a catch arm 62. The attachment arms 60 couple to the base portion 52. The catch arm 62 couples to the attachment arms 60. In one arrangement, the arms 60, 62 of the catch portions 54-1, 54-2 and the base portion 52 form a unitary member (i.e., a single, integrated part) thus providing a simple and straight forward design. In one arrangement, the base portion 52 and catch portions 54-1, 54-2 are formed substantially of acrylonitrile butadiene styrene polycarbonate material (i.e., ABS/PC alloy), or material that provides similar toughness and flexibility. In one arrangement, the catch arm 62 provides a ramped (or tapered) surface 64 to facilitate latching (e.g., latch actuation) with a corresponding latch mechanism of a panel 32 (FIG. 1).

The portion 50 of the rigid support member 26 is essentially an elongated rail formed of rigid material (e.g., sheet metal, aluminum, plastic, combinations thereof, etc.). As shown in FIGS. 2 and 3, the rigid support member 26 defines a set of mounting holes 66 and marks 68. The marks 68 delineate standard height increments 70 (e.g., 1U, 2U, etc.).

To install the fastener 34 onto the rigid support member 26, the user first selects a particular groove 58-1, 58-2 into which the portion 50 of the rigid support member 26 will be inserted. The symbols 56 defined by the base portion 52 of the fastener 34 direct the user to use (i) groove 58-1 for panels 32 of odd increment standard heights (e.g., 1U, 3U, 5U, etc.), and (ii) groove 58-2 for panels 32 of even increment standard heights (e.g., 2U, 4U, etc.). After the user selects a groove 58-1, 58-2, the user identifies an appropriate mounting location 72 along the rigid support member 26.

By way of example only, suppose that the user wishes to fasten a 3U height panel 32 and has identified a 1U segment between the marks 68 as the mounting location 72 of the rigid support member 26. To attach the fastener 34, the user aligns the groove 58-1 (defined by the base portion 52 of the fastener 34) over the mounting location 72 such that the opening of the groove 58-1 faces the mounting location 72 (see FIG. 2). The user then moves the fastener 34 in a direction 74 toward the rigid support member 26 such that the portion 50 of the rigid support member 26 inserts into the groove 58-1. As will be explained in further detail shortly, each fastener 34 (i) further includes a set of bosses which are configured to align with and engage the rigid support member 26 at the mounting holes 66, and (ii) is configured to slightly flex as shown by the arrows 76 such that the openings of the grooves 58-1 58-2 become slightly larger during fastener installation and during fastener removal. Accordingly, the portion 50 of the rigid support member 26 inserts within the groove 58-1 in a secure manner (see FIG. 3). Moreover, a user can manually install the fastener 34 quickly and without the need for any hardware. Further details of the invention will now be provided with reference to FIGS. 4A through 4D.

FIGS. 4A through 4D show portions of the rack system 20 with a panel assembly 30 in various states of installation. For simplicity, focus is directed to one side of a front access area 33 (also see FIG. 1). Nevertheless, it should be understood that a similar discussion of the other side of the front access area 33 simultaneously applies.

Figure 4A:
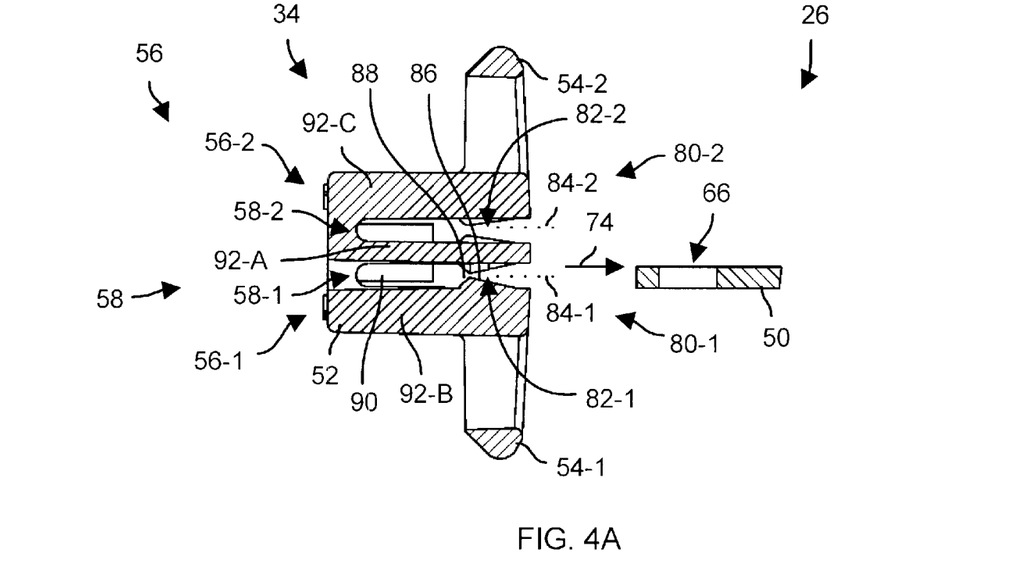
FIG. 4A is a cross-sectional top view of the portion of the rack system of FIG. 2 in the unconnected state.

FIG. 4A is a cross-sectional top view of a panel mounting location of the rack system 20. Here, the user has aligned a fastener 34 with a portion 50 of a rigid support member 26 in order to connect the fastener 34 to the portion 50 of the rigid support member 26. In particular, the user has chosen to use groove 58-1 rather than groove 58-2 and has aimed the opening 80-1 of the groove 58-1 rather than the opening 80-2 of the groove 58-2 toward the portion 50 of the rigid support member 26. The symbols 56 defined by the base portion 52 facilitate the user's choice of grooves 58-1, 58-2. For example, a symbol 56-1 adjacent the groove 58-1 indicates that the groove 58-1 is for panels 32 having odd standard height increments (e.g., 1U, 3U, etc.). Similarly, a symbol 56-2 adjacent the groove 58-2 indicates that the groove 58-2 is for panels 32 having even standard height increments (e.g., 2U, 4U, etc.). By way of example only, the user intends to insert the portion 50 of the rigid support member 26 into the groove 58-1 because the user intends to subsequently fasten a panel 32 which has a height substantially equal to an odd standard height increment (i.e., 3U).

As shown in FIG. 4A, the fastener 34 includes a first set of bosses 82-1 and a second set of bosses 82-2. In one arrangement, the bosses 82-1, 82-2 are protrusions which mimic the shape of the mounting holes 66 of the rigid support member 26 (e.g., the bosses 82-1, 82-2 are rounded-faced protrusions). Each of the first set of bosses 82-1 couples to the base portion 52 and extends into the groove 58-1 toward a mid-plane 84-1 of the groove 58-1. Similarly, each of the second set of bosses 82-2 couples to the base portion 52 and extends into the groove 58-2 toward a mid-plane 84-2 of the groove 58-2.

As further shown in FIG. 4A, each boss 82-1, 82-2 has a first ramped surface 86 which facilitates engagement of the fastener 34 with the rigid support member 26 when the user attaches the fastener 34 to the electronic cabinet frame 22 (also see FIG. 1). Each boss 82-1, 82-2 further has a second ramped surface 88 which is steeper than the first ramped surface 86 and which makes disengagement of the fastener 34 from the rigid support member 26 more difficult than engagement during installation.

Additionally, each fastener 34 further includes interference tabs 88 within the grooves 58-1, 58-2 which facilitate proper alignment of the rigid support member 26 within the fastener 34, i.e., which pushes against the rigid support member 26 to evenly position the rigid support member 26 within the grooves 58-1, 58-2. In particular, as the user moves the fastener 34 toward the portion 50 of the rigid support member 26 in the direction 74, the portion 50 pushes against the ramped surfaces 86 of one of the sets of bosses 82-1, 82-2 such that the material of the fastener 34 flexes and enables that set of bosses 82-1, 82-2 to enter the mounting holes 66 defined by the rigid support member 26. The rigid support member 26 eventually interferes with the interference tabs 88 thus preventing the rigid support member 26 from inserting too far within a groove 82-1, 82-2 and properly orienting the fastener 34 relative to the rigid support member 26. The ramped surfaces 88 of the bosses 82-1, 82-2 facilitate the engagement process between the fastener 34 with the rigid support member 26, as well as retain the fastener 34 to the rigid support member 26.

Figure 4B:
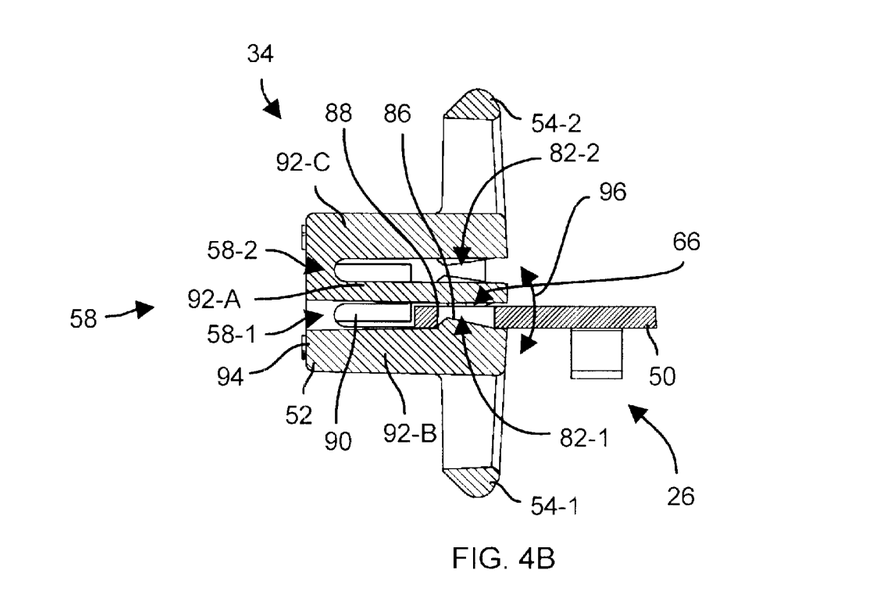
FIG. 4B. is a cross-sectional top view of the portion of the rack system of FIG. 2 in the connected state.

FIG. 4B shows the portion 50 of the rigid support assembly 26 when properly and fully inserted into the groove 58-1 defined by the base portion 52 of the fastener 34. At this point, various parts of the base portion 52 of the fastener 34 have flexed thus enabling the bosses 82-1 to engage the mounting holes 66 of the rigid support member 26 and thus hold the fastener 34 in place. In particular, during insertion of the portion 50 into the groove 58-1, the sections 92-A, 92-B opened in a hinge-like manner about a hinge section 94 (see arrows 96) thus enabling the fastener 34 to secure to the portion 50 rigid support member 26.

It should be understood that the user performs a similar procedure on another rigid support member 26 on the other side of the electronic cabinet frame 22 (see the rail 36-1 which is across the access area 33 from the rail 36-2 in FIG. 1). For instance, the user manually attaches a fastener 34 to the vertical rail 36-2 (FIGS. 4A and 4B), and then manually attaches another fastener 34 to the vertical rail 36-1 at the same height. Now the user is ready to fasten a panel 32 to the fasteners 34 in order to secure the panel 32 over the access area 33.

Figure 4C:
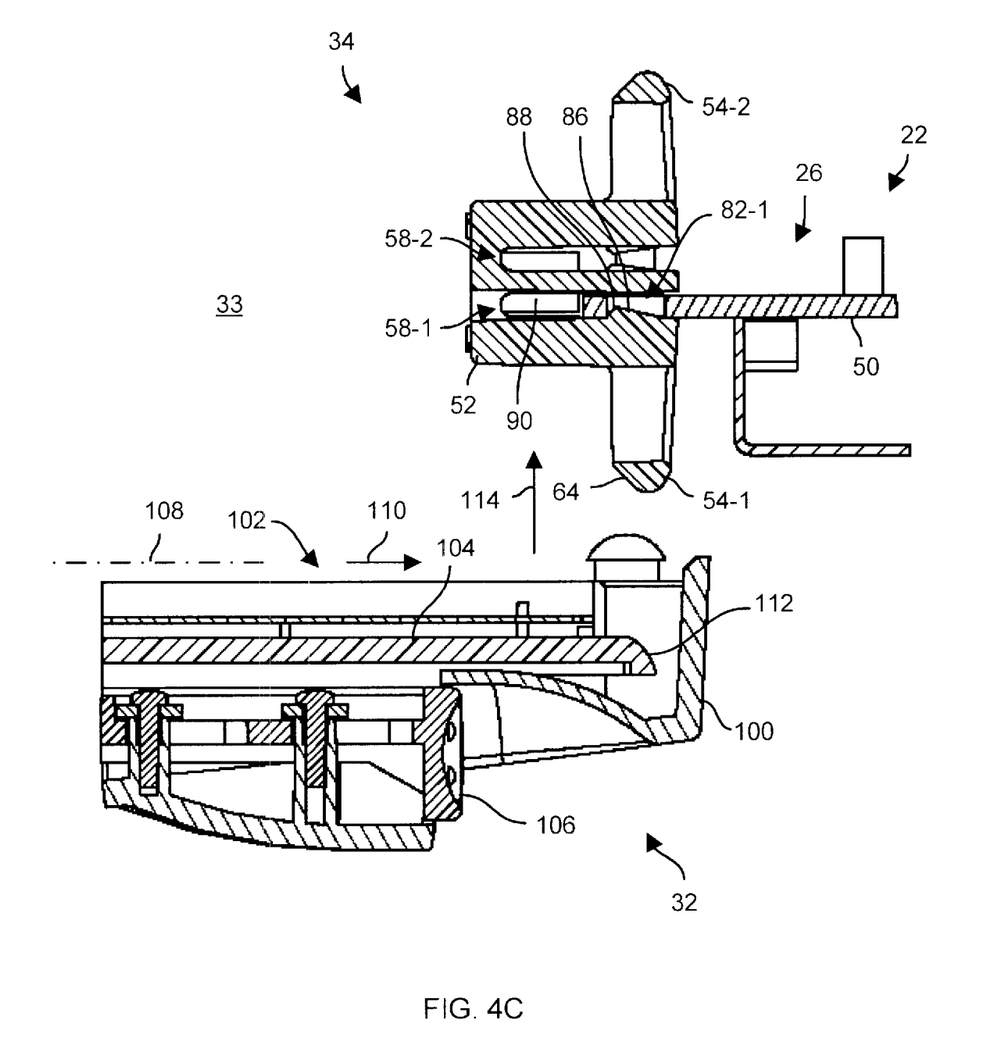
FIG. 4C is a cross-sectional top view of the portion of the rack system of FIG. 2 when a panel is aligned with and about to latch with the portion.
Figure 4D:
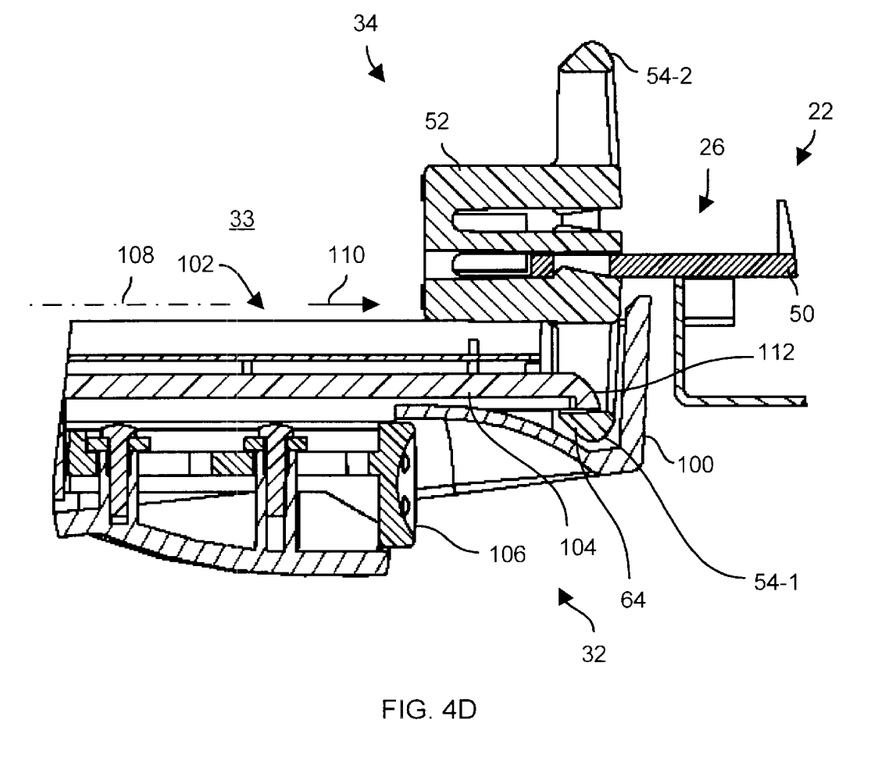
FIG. 4D is a cross-sectional top view of the portion of the rack system of FIG. 2 when the panel is aligned with and latched with the portion.

FIGS. 4C and 4D show cross-sectional top views of a panel mounting location of the rack system 20 after the fastener 34 has been attached (also see the mounting location 72 in FIG. 2). FIG. 4C shows a panel 32 properly aligned with the mounting location. FIG. 4D shows the panel 32 fastened at the mounting location.

As shown in FIGS. 4C and 4D, the panel 32 includes a cover 100 and a latch mechanism 102. In one arrangement, the cover 100 has a geometry corresponding to the shape and size of the access area 33 (FIG. 1), e.g., a width to accommodate a standard rack width of 19-inches and a height having a standard increment such as 3U's. The latch mechanism 102 mounts to the cover 100 and controls latching and de-latching of the cover 100 with the fastener 34 which is now mounted to the electronic cabinet frame 22. It should be understood that the cover 100 includes another latch mechanism 102 on the other side (see FIG. 1) which controls latching and de-latching of the cover 100 with another fastener 34 mounted to the electronic cabinet frame 22.

The latch mechanism 102 includes a latch member 104 (or simply "a catch 104") and a button member 106 which are movable relative to the cover 100 of the panel 32. In particular, both the latch member (or catch) 104 and the button member 106 are configured to slide laterally along the axis 108 which is parallel to the plane of the cover 100 (e.g., see the midline 42 of the panel 32-B in FIG. 1). Both the latch member 104 and the button member 106 are spring-loaded and are continuously urged in the direction 110 (e.g., by a single spring, by multiple springs, etc.). In one arrangement, the latch member 104 is configured to move independently in a direction that is opposite the direction 110 to permit locking of the button member 106 in place (e.g., for security) while still permitting the latch member 104 to move in order to latch with the fastener 34.

As shown in FIG. 4C, a tabbed end of the latch member 104 provides a ramped surface 112. When the user moves the panel 32 toward the electronic cabinet frame 22 in the direction 114, the ramped surface 112 of the latch member 104 contacts the ramped surface 64 of the fastener 34. Further movement of the panel 32 toward the electronic cabinet frame 22 causes the latch member 104 to actuate in the direction opposite the direction 110 and to overcome the spring force that urges the latch member 104 in the direction 110. Accordingly, the latch member 104 deflects in the direction opposite the direction 110 until the ramped surfaces 112, 64 no longer contact each other. Then, the latch member 104 moves back to its original position, i.e., moves in the direction 110 due to a spring force in order to latch the panel 32 to the fastener 34.

FIG. 4D shows the panel 32 securely attached to the fastener 34. That is, the latch mechanism 102 has engaged the panel 32 with the fastener 34 which is mounted to the rigid support member 26 of the electronic cabinet frame 22. In particular, the end of the latch member 104 (i.e., a latching tab portion of latch member 104) interferes with the catch member 54-1 of the fastener 34 thus preventing the panel 32 from inadvertently disengaging from the fastener 34. It should be understood that a similar operation has occurred concurrently on the other side of the access opening 33. Accordingly, the panel 32 is now fastened to the electronic cabinet frame 34. As a result, the panel 32 inhibits access through the access opening 33, e.g., prevents external objects from accidentally entering the rack system 20 through the access opening 33 and contacting equipment, discourages unauthorized tampering of the equipment, etc.

It should be understood that the user can remove the panel 32 by actuating the latch mechanisms 102 using the button members 106. In particular, the user can push the button member 106 in the direction opposite the direction 110 to overcome the spring force which biases the latch member 104 and the button member 106 in the direction 110. In response, the button member 106 will move the latch member 104 in the direction opposite the direction 110 thus de-latching the panel 32 from the fastener 34. In one arrangement, the panel 32 includes a lock that prevents movement of the button member 106 without a key for additional security. Further details of the invention will now be provided with reference to FIGS. 5 and 6.

Figure 5:
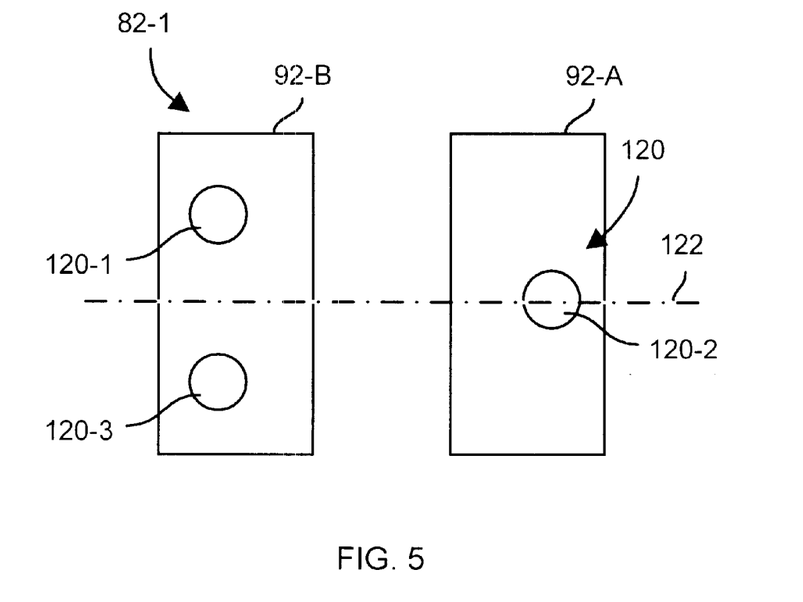
FIG. 5 is a view of a first set of bosses of a fastener of the rack system of FIG. 1.
Figure 6:
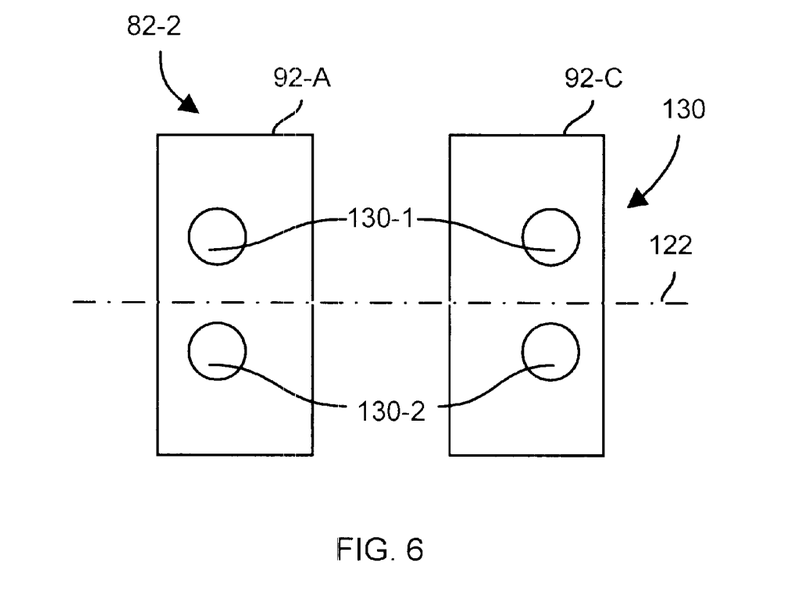
FIG. 6 is a view of a second set of bosses of the fastener of the rack system of FIG. 1.

FIGS. 5 and 6 show, by way of example only, placements for the sets of bosses 82-1, 82-2 within the grooves 58-1, 58-2 of the fastener 34. Due to the staggered placement of the bosses 82-1, 82-2, it should be understood that the fastener 34 is well suited for fastening panels 32 of various heights.

FIG. 5 shows the set of bosses 82-1 relative to the base portion sections 92-A, 92-B as viewed from the mid-plane 84-1 of FIG. 4A (e.g., as if the sections 92-A, 92-B were opened completely onto a single plane). As shown, the set of bosses 82-1 include individual protrusions 120 which respectively correspond to mounting holes 66 of the rigid support member 26 (also see FIG. 2). In particular, protrusion 120-1 is configured to enter a first mounting hole 66 from the section 92-B, protrusion 120-2 is configured to enter a second mounting hole 66 from the section 92-A, and protrusion 120-3 is configured to enter a third mounting hole 66 again from the section 92-B. The aggregate result of engaging these three protrusions 120 into respective mounting holes 66 of the rigid support member 26 provides for a robust and reliable connection of the fastener 34 to the electronic cabinet frame 22. This configuration is well-suited for attaching the fastener 34 to locations along a rigid support member 26 at standard odd height increments (e.g., 11U, 3U, etc.) such as when centering a 3U-tall around the increment 70 of the rigid support member 26 of FIG. 2.

FIG. 6 shows the set of bosses 82-2 relative to the base portion sections 92-A, 92-C as viewed from the mid-plane 84-2 of FIG. 4A (e.g., as if the sections 92-A, 92-C were opened completely onto a single plane). As shown in FIG. 6, the set of bosses 82-2 include pairs of protrusions 130 which respectively correspond to mounting holes 66 of the rigid support member 26 (also see FIG. 2). In particular, protrusion pair 130-1 is configured to enter a first mounting hole 66, and protrusion pair 130-2 is configured to enter a second mounting hole 66 from the section 92-A. The aggregate result of engaging these two pairs of protrusions 130 into respective mounting holes 66 of the rigid support member 26 provides for a robust and reliable connection of the fastener 34 to the electronic cabinet frame 22. This configuration is well-suited for attaching the fastener 34 to locations along a rigid support member 26 at standard even height increments (e.g., 2U, 4U, etc.) such as when centering a 2U-tall around the increment 70 of the rigid support member 26 of FIG. 2.

From a comparison of the positions of the sets of bosses 82-1, 82-2 in FIGS. 5 and 6, it should be understood that the positions of the bosses 120 are offset (i.e., staggered) from the positions of the bosses 130. In particular, as shown in FIG. 5, the middle protrusion 120 of the groove 58-1 is in line with a midline 122 of the fastener 34. In contrast, as shown in FIG. 6, the protrusion pairs 130 of the groove 58-2 are disposed a fixed distance from the midline 122 of the fastener 34. Furthermore, with reference back to FIG. 5, the outer protrusions 120 of the groove 58-1 are disposed a further distance from the midline 122. Accordingly, if the fastener 34 mounts to the rigid support member 26 at a first height when the rigid support member 26 engages the first groove 58-1, the fastener 34 mounts to the rigid support member 26 at a second height which is slightly higher or lower than the first height when the rigid support member 26 engages the second groove 58-2. The user can move the fastener 34 as just described by removing the fastener 34 from the rigid support member 26 (i.e., pulling the rigid support member 26 from the first groove 58-1, turning the fastener 34 upside down and reattaching the fastener 34 to the rigid support member 26 using the second groove 58-2. As a result, the user can position a panel 32 at a variety of different heights. Further details of the invention will now be provided with reference to FIG. 7.

Figure 7:
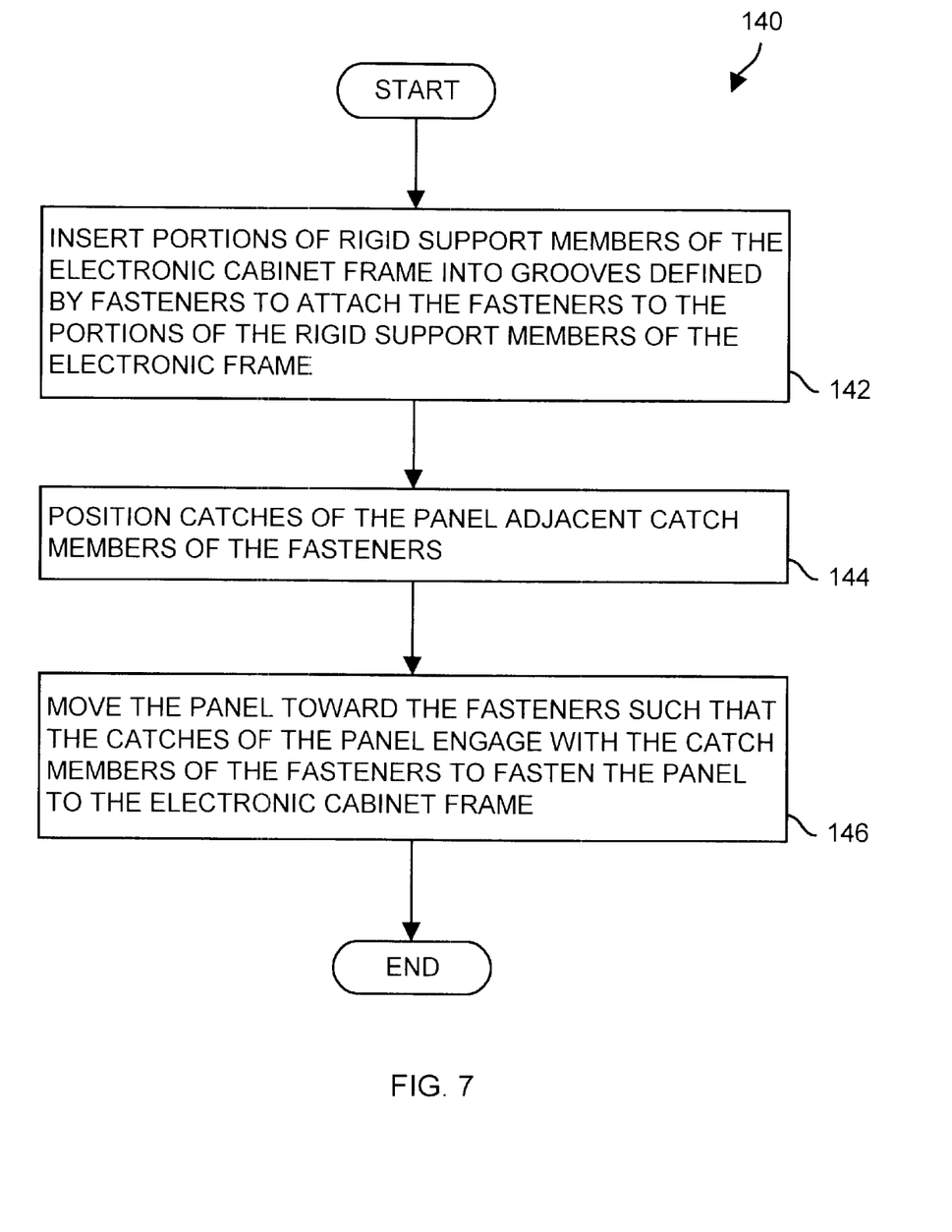
FIG. 7 is a flowchart of a procedure which is performed by a user when fastening a panel of the rack system of FIG. 1.

FIG. 7 shows a procedure 140 which is performed by a user when fastening a panel 32 to the electronic cabinet frame 22. In step 142, the user inserts portions of the rigid support members 26 of the electronic cabinet frame 22 into grooves 58 of the fasteners 34 (also see FIGS. 1, 2 and 3). In response, the fasteners 34 attach to the rigid support member 26 in a secure manner (see FIGS. 3 and 4B).

In step 144, the user positions catches 104 (see the latch members 104 of FIGS. 4C and 4D) of the panel 32 adjacent corresponding catch portions 54 (i.e., catch members) of the fasteners 34. At this point, the user has aligned the panel 32 with the electronic cabinet frame 22 such that the latch mechanisms 102 are ready to latch the panel 32 to the electronic cabinet frame 22 (FIG. 4C).

In step 146, the user moves the panel 32 toward the fasteners 34 such that the catches 104 of the panel 32 engage with the catch portions 54 of the fasteners 34 thus fastening the panel 32 to the electronic cabinet frame 22 (FIG. 4D). It should be understood that the above-described installation steps did not require the use of any hardware. That is, no screws or other hardware is required to mount either the fasteners 34 or the panel 32.

As described above, the invention is directed to techniques for fastening a panel 32 to an electronic cabinet frame 22 using grooved fasteners 34 that secure to the electronic cabinet frame 22 without the need for hardware. The fasteners 34 permit fastening of the panel 32 to the frame 22 in a reliable fashion. Accordingly, installation can occur in a quick and simple manner without requiring extensive hardware costs and installation time. Moreover, the fasteners 34 (if made of non-conductive material or if coated with non-conductive material) minimize the possibility of causing equipment damage or injury that could otherwise occur due to dropped conductive hardware or due to contacting live conductors using conductive tools that typically attach the hardware in the conventional panel mounting approach. Additionally, since hardware is unnecessary, there are no installation delays or improper installations due to missing hardware.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that removal of a fastener 34 from a rigid support member 26 can occur in a simple and straight forward manner similar to that during installation. In particular, the user can grasp the fastener 34 and unhinge the fastener 34 from the rigid support member 26. That is, the user flexes sections 92-A, 92-B of the base portion 52 about a hinge section 94 of the base portion 52 (see FIG. 4B) to open the groove 58 into which the rigid support member 26 is fastened. In response to such flexing and a pulling force from the user, the bosses 82 exit the mounting holes of the rigid support member 26 and enable the fastener 34 to disconnect from the rigid support member 26. Accordingly, no special tools are needed to unfasten the fastener 34 from the rigid support member 26. Furthermore, there is no loose hardware that could otherwise inadvertently drop into the equipment housed in the electronic cabinet frame 22.

Additionally, it should be understood that the fastener 34 is well suited for fastening panels 32 of a variety of heights. To this end, recall that the fastener 34 has multiple grooves 58 and multiple catch portions 54. If the user needs to slightly move a panel to a new position (e.g., a half U distance higher or lower to accommodate a different size panel 32 which is taller or shorter by 1U), the user can simply remove the fasteners 34 at the ends of the cabinet front (see the access area 33 of FIG. 1), turn the fasteners 34 upside down, and install the fasteners 34 using different grooves 58 from the originally used grooves 58.

Figure 8:
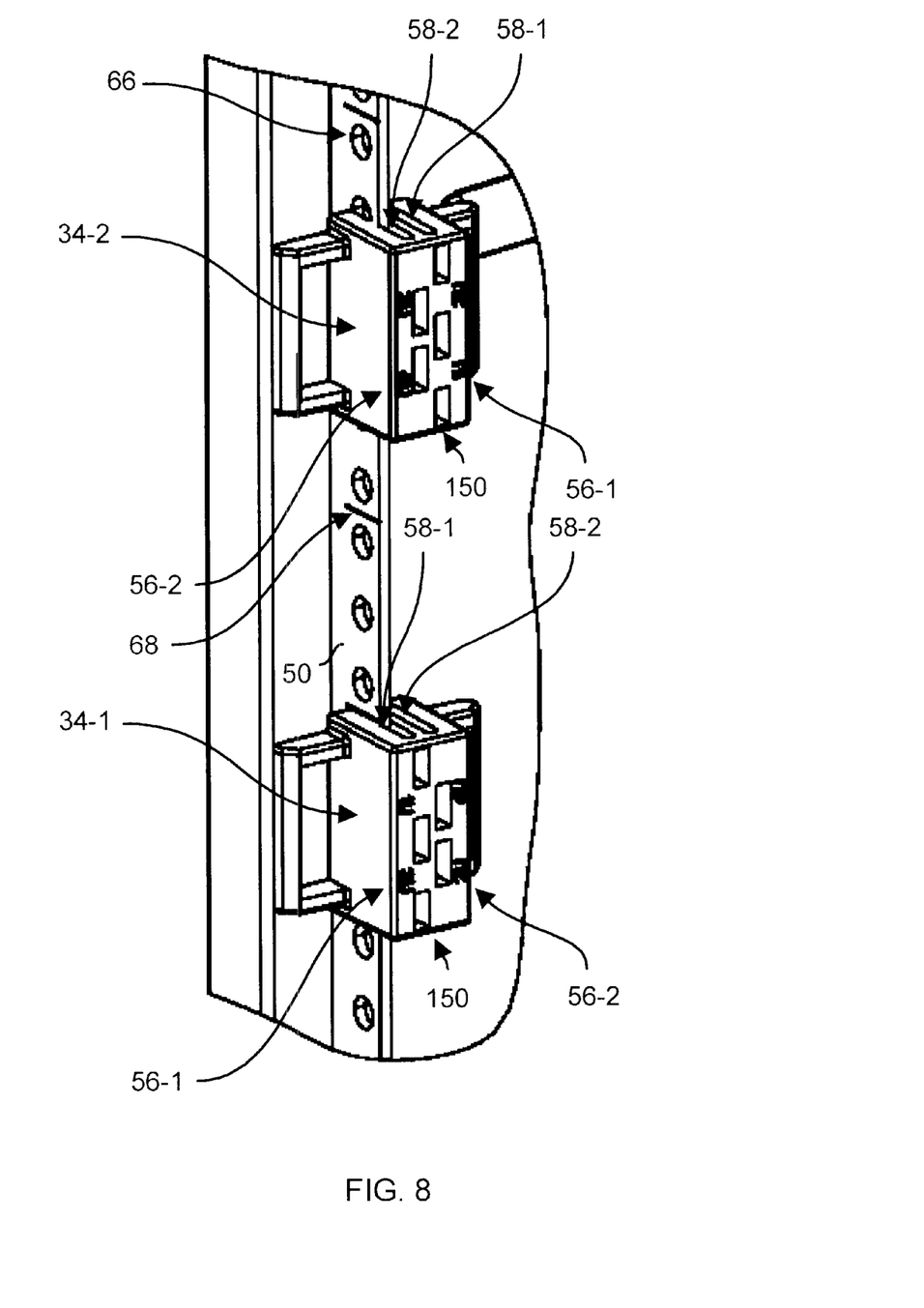
FIG. 8 is a perspective view illustrating the ability of the fastener of FIGS. 5 and 6 to mount to different offset locations along a rigid support member of the rack system of FIG. 1.

FIG. 8 shows fasteners 34 at different heights along a rigid support member 26 (i.e., a vertical rail) of the electronic cabinet frame 22 (also see FIG. 1). The fastener 34-1 is placed between marks 68 of the rigid support member 26 in order to mount panels of an odd standard height (e.g., 1U, 3U, etc.) by inserting a portion of the rigid support member 26 into the groove 58-1. In contrast, the fastener 34-2 is placed over a portion of the rigid support member 26 such that the fastener 34-2 straddles a mark 68 in order to mount panels of an even standard height (e.g., 2U, 4U, etc.) by inserting a portion of the rigid support member 26 into the groove 58-2. Note that the fastener 342 is upside down relative to the fastener 34-1.

As shown in FIG. 8, the symbols 56 direct the user as to which groove 58 to use.

In particular, the symbols 56-1 (i.e., "1U 3U") direct the user to use adjacent groove 58-1 for odd U-sizes. Similarly, the symbols 56-2 (i.e., "2U 4U") direct the user to use adjacent groove 58-2 for even U-sizes. Other symbols are suitable for use as well such as "Odd" and "Even", etc.

FIG. 8 further shows that tooling holes 150 can be incorporated into the fasteners 34 to facilitate manufacture of the fasteners 34. Such tooling holes 150 extend completely through the hinge sections 94 of the base portions 52 and into the grooves 58 of the fasteners 34 thus enabling use of a minimal number of tools (e.g., two) when forming the fasteners 34. In particular, the tooling holes 150 accommodate tool parts that facilitate proper formation of the bosses 120, 130 within the grooves 58 of the fasteners 34. Other tooling hole arrangements are also suitable for use by the invention.

Additionally, it should be understood that installation of the fasteners 34 and the panels 32 was described above as being performed manually by a user by way of example only. In other arrangements, some or all of the installation steps are performed in more of an automated manner (e.g., by automated equipment).

Furthermore, it should be understood that the fasteners 34 were described above as being suitable for fastening panels 32 having latching mechanisms disposed along midlines 42 (see FIG. 1) by way of example only. In some arrangements, the panels 32 of the panel assemblies 30 include latch mechanisms which are offset from the midline 42. Such modifications and enhancements are intended to fall within the spirit and scope of various arrangements of the invention.

What is claimed is:

1. A rack system, comprising:
    an electronic cabinet frame to support electronic equipment, the electronic cabinet frame including a set of rigid support members; and
    a panel assembly to cover an access area defined by the electronic cabinet frame, the panel assembly including (i) a panel, and (ii) a set of fasteners to fasten the panel to an electronic cabinet frame, each fastener having:
        a base portion defining a groove such that, when a portion of a rigid support member of the set of rigid support members inserts within the groove defined by the base portion of that fastener, the base portion attaches to the portion of that rigid support member of the set of rigid support members, and
        a catch portion coupled to the base portion of that fastener, the catch portion being configured to engage with the panel to fasten the panel to the electronic cabinet frame when the portion of that rigid support member of the set of rigid support members inserts within the groove defined by the base portion.

2. A panel assembly, comprising:
    a panel; and
    a set of fasteners to fasten the panel to an electronic cabinet frame, each fastener having:
        a base portion defining a groove such that, when a portion of a rigid support member of the electronic cabinet frame inserts within the groove defined by the base portion of that fastener, the base portion attaches to the portion of that rigid support member of the electronic cabinet frame, and
        a catch portion coupled to the base portion of that fastener, the catch portion being configured to engage with the panel to fasten the panel to the electronic cabinet frame when the portion of that rigid support member of the electronic cabinet frame inserts within the groove defined by the base portion.

3. A fastener for fastening a panel to an electronic cabinet frame, the fastener comprising:
    a base portion defining a groove such that, when a portion of a rigid support member of the electronic cabinet frame inserts within the groove defined by the base portion, the base portion attaches to the portion of the rigid support member of the electronic cabinet frame; and
    a catch portion coupled to the base portion, the catch portion being configured to engage with the panel to fasten the panel to the electronic cabinet frame when the portion of the rigid support member of the electronic cabinet frame inserts within the groove defined by the base portion.

4. The fastener of claim 3, further comprising:
    a set of bosses coupled to the base portion, wherein each boss of the set of bosses extends toward a mid-plane of the groove defined by the base portion.

5. The fastener of claim 4 wherein each boss of the set of bosses defines a ramped surface.

6. The fastener of claim 4 wherein the set of bosses includes:
    a first subset of bosses which extends from the base portion in a first direction toward the mid-plane of the groove defined by the base portion; and
    a second subset of bosses which extends from the base portion in a second direction toward the mid-plane of the groove of the groove defined by the base portion, the second direction being substantially opposite to the first direction.

7. The fastener of claim 2 wherein the base portion includes:
    a first section;
    a second section; and
    a hinge section that connects to the first section and the second section such that (i) the first section and the second section reside in a substantially parallel orientation relative to each other to define the groove, and (ii) one of the first section and the second section hinges relative to the other in response to a force applied to at least one of the first section and the second section when the portion of the rigid support member of the electronic cabinet frame inserts within the groove defined by the base portion.

8. The fastener of claim 7 wherein the hinge portion further defines a set of tooling holes that extend completely through the hinge section.

9. The fastener of claim 3 wherein the groove defined by the base portion is a first groove; wherein the base portion further defines a second groove such that, when the portion of the rigid support member of the electronic cabinet frame inserts within the second groove defined by the rigid support member, the base portion attaches to the portion of the rigid support member of the electronic cabinet frame; wherein the catch portion coupled to the base portion is a first catch portion, and wherein the fastener further comprises:
    a second catch portion coupled to the base portion, the second catch portion being configured to engage with another panel to fasten the other panel to the electronic cabinet frame when the portion of the rigid support member of the electronic cabinet frame inserts within the second groove defined by the base portion.

10. The fastener of claim 9 wherein the fastener further comprises:
    a first set of bosses that extend from the base portion within the first groove, and a second set of bosses that extend from the base portion within the second groove; and wherein positions of the first set of bosses within the first groove are offset relative to positions of the second set of bosses within the second groove.

11. The fastener of claim 9 wherein the base portion further defines a set of visible symbols to direct a user to properly orient the fastener with the portion of the rigid support member of the electronic cabinet frame.

12. The fastener of claim 3, further comprising:

a set of interference tabs coupled to the base portion, wherein each interference tab of the set of interference tabs extends into a portion of the groove to evenly position the portion of the rigid support member of the electronic cabinet frame within the groove defined by the base portion when the portion of the rigid support member of the electronic cabinet frame inserts within the groove defined by the base portion.

13. The fastener of claim 3 wherein each of the base portion and the catch portion substantially includes acrylonitrile butadiene styrene polycarbonate material.

14. A method for fastening a panel to an electronic cabinet frame, the method comprising the steps of:

inserting portions of rigid support members of the electronic cabinet frame into grooves defined by fasteners to attach the fasteners to the portions of the rigid support members of the electronic cabinet frame;

positioning catches of the panel adjacent catch members of the fasteners; and moving the panel toward the fasteners such that the catches of the panel engage with the catch members of the fasteners to fasten the panel to the electronic cabinet frame.

15. The method of claim 14, further comprising the steps of:

disengaging the catches of the panel from the catch members of the fasteners to unfasten the panel from the electronic frame; and prying the fasteners from the portions of the rigid support members of the electronic cabinet frame to detach the fasteners from the portions of the rigid support members of the electronic cabinet frame.

16. The method of claim 15 wherein the step of prying the fasteners from the portions of the rigid support members of the electronic cabinet frame includes the step of:

opening each fastener in a hinge-like manner to detach that fastener from a portion of a rigid support member of the electronic cabinet frame.

17. The method of claim 15, further comprising the step of:

turning the fasteners upside-down from initial orientations of the fasteners when the portions of the rigid support members of the electronic cabinet frame insert into the grooves defined by the fasteners; and inserting the portions of the rigid support members of the electronic cabinet frame into alternative grooves defined by the fasteners to attach the fasteners to the portions of the rigid support members of the electronic cabinet frame.

18. The rack system of claim 1 wherein each fastener is configured to fasten to a substantially vertically extending rigid support member in response to movement of that fastener in a substantially horizontal direction relative to the substantially vertically extending rigid support member.

19. The panel assembly of claim 2 wherein each fastener is configured to fasten to a substantially vertically extending rigid support member in response to movement of that fastener in a substantially horizontal direction relative to the substantially vertically extending rigid support member.

20. The fastener of claim 3 wherein the fastener is configured to fasten to the portion of the rigid support member in response to movement of the fastener in a substantially horizontal direction relative to the portion of the rigid support member.

* * * * *